US011881925B2

(12) United States Patent
Atkinson et al.

(10) Patent No.: US 11,881,925 B2
(45) Date of Patent: *Jan. 23, 2024

(54) SYSTEM FOR OPERATING MULTIPLE TRANSCEIVER MODULES CONCURRENTLY

(71) Applicant: NIKE, Inc., Beaverton, OR (US)

(72) Inventors: Shannon Atkinson, Lake Oswego, OR (US); Holli Pheil, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/942,355

(22) Filed: Sep. 12, 2022

(65) Prior Publication Data

US 2023/0006729 A1     Jan. 5, 2023

Related U.S. Application Data

(63) Continuation of application No. 17/175,757, filed on Feb. 15, 2021, now Pat. No. 11,444,685, which is a
(Continued)

(51) Int. Cl.
*H04B 7/155* (2006.01)
*H04B 1/525* (2015.01)
(Continued)

(52) U.S. Cl.
CPC ....... *H04B 7/15535* (2013.01); *H03F 1/0288* (2013.01); *H03F 1/56* (2013.01);
(Continued)

(58) Field of Classification Search
CPC . H03F 1/0288; H03F 1/56; H03F 3/24; H03F 3/602; H03F 3/62; H04B 1/005;
(Continued)

(56) References Cited

U.S. PATENT DOCUMENTS 6,018,644 A    1/2000 Minarik
6,108,313 A    8/2000 Lee et al.
(Continued)

FOREIGN PATENT DOCUMENTS

WO   2007028050   2/2007
WO   2016196221   12/2016

OTHER PUBLICATIONS

"International Application Serial No. PCT US2016 034436, Invitation to Pay Add'l Fees and Partial Search Rpt dated Jul. 12, 2016", 7 pgs.
(Continued)

*Primary Examiner* — Nguyen T Vo
(74) *Attorney, Agent, or Firm* — Schwegman, Lundberg & Woessner, P.A.

(57) ABSTRACT

Embodiments describe systems, apparatuses, and methods for transmitting/receiving signal data to/from a plurality of transceiver modules. Devices in accordance with some embodiments can include a plurality of wireless transceiver modules, each wireless transceiver module to be communicatively coupled to a corresponding external transceiver mixture, one or more antennas to exchange signal data with the plurality of external transceiver modules, a radio frequency (RF) circulator, and one or more amplifiers to amplify the signal data received by the one or more antennas and signal data to be transmitted by the one or more antennas. The use of the RF circulator prevents transmitting signals that may collide with each other and cause interference with the communications.

20 Claims, 8 Drawing Sheets

Related U.S. Application Data continuation of application No. 15/575,848, filed as application No. PCT/US2016/034436 on May 26, 2016, now Pat. No. 10,924,177.

(60) Provisional application No. 62/168,101, filed on May 29, 2015.

(51) Int. Cl.

| | | |
|---|---|---|
| *H03F 1/02* | (2006.01) | |
| *H03F 1/56* | (2006.01) | |
| *H03F 3/24* | (2006.01) | |
| *H03F 3/60* | (2006.01) | |
| *H03F 3/62* | (2006.01) | |
| *H04B 1/00* | (2006.01) | |
| *H04B 1/403* | (2015.01) | |
| *H04B 1/52* | (2015.01) | |

(52) U.S. Cl.
CPC .............. *H03F 3/24* (2013.01); *H03F 3/602* (2013.01); *H03F 3/62* (2013.01); *H04B 1/005* (2013.01); *H04B 1/406* (2013.01); *H04B 1/52* (2013.01); *H04B 1/525* (2013.01)

(58) Field of Classification Search
CPC .......... H04B 1/406; H04B 1/52; H04B 1/525; H04B 7/15535
See application file for complete search history.

(56) References Cited

U.S. PATENT DOCUMENTS

| | | | |
|---|---|---|---|
| 6,204,813 B1 | 3/2001 | Wadell et al. | |
| 6,226,275 B1 | 5/2001 | Yang et al. | |
| 6,643,522 B1* | 11/2003 | Young | H04B 1/406 |
| | | | 455/552.1 |
| 10,924,177 B2* | 2/2021 | Atkinson | H04B 7/15535 |
| 11,444,685 B2* | 9/2022 | Atkinson | H03F 3/602 |
| 2004/0192194 A1 | 9/2004 | Zhen et al. | |
| 2006/0234627 A1 | 10/2006 | Cartin et al. | |
| 2007/0117524 A1 | 5/2007 | Do | |
| 2009/0130874 A1 | 5/2009 | Englund | |
| 2011/0279178 A1 | 11/2011 | Outaleb et al. | |
| 2012/0207065 A1 | 8/2012 | Shida et al. | |
| 2014/0266399 A1 | 9/2014 | Corman et al. | |
| 2014/0354887 A1 | 12/2014 | Wu | |
| 2015/0030334 A1 | 1/2015 | Eiselt et al. | |
| 2015/0323968 A1 | 11/2015 | Chong et al. | |
| 2017/0257152 A1* | 9/2017 | Le-Ngoc | H04B 1/10 |
| 2018/0131435 A1 | 5/2018 | Atkinson et al. | |
| 2021/0167845 A1 | 6/2021 | Atkinson et al. | |

OTHER PUBLICATIONS

"International Application Serial No. PCT US2016 034436, International Search Report dated Sep. 5, 2016", 4 pgs.

"International Application Serial No. PCT US2016 034436, Written Opinion dated Sep. 5, 2016", 7 pgs.

"International Application Serial No. PCT US2016 034436, International Preliminary Report on Patentability dated Dec. 14, 2017", 9 pgs.

"U.S. Appl. No. 15/575,848, Restriction Requirement dated Jun. 6, 2018", 9 pgs.

"U.S. Appl. No. 15/575,848, Examiner Interview Summary dated Jun. 15, 2018", 2 pgs.

"U.S. Appl. No. 15/575,848, Response filed Aug. 6, 2018 to Restrictrion Requirement dated Jun. 6, 2018", 7 pgs.

"U.S. Appl. No. 15/575,848, Non Final Office Action dated Sep. 19, 2018", 13 pgs.

"U.S. Appl. No. 15/575,848, Examiner Interview Summary dated Nov. 14, 2018", 3 pgs.

"U.S. Appl. No. 15/575,848, Response filed Dec. 19, 2018 to Non Final Office Action dated Sep. 19, 2018", 10 pgs.

"U.S. Appl. No. 15/575,848, Non Final Office Action dated Jan. 18, 2019", 13 pgs.

"U.S. Appl. No. 15/575,848, Examiner Interview Summary dated Feb. 8, 2019", 3 pgs.

"U.S. Appl. No. 15/575,848, Examiner Interview Summary dated Apr. 10, 2019", 3 pgs.

"U.S. Appl. No. 15/575,848, Response filed May 20, 2019 to Non Final Office Action dated Jan. 18, 2019", 9 pgs.

"U.S. Appl. No. 15/575,848, Final Office Action dated Jun. 12, 2019", 13 pgs.

"U.S. Appl. No. 15/575,848, Response filed Oct. 14, 2019 to Final Office Action dated Jun. 12, 2019", 9 pgs.

"U.S. Appl. No. 15/575,848, Non Final Office Action dated Nov. 4, 2019", 14 pgs.

"U.S. Appl. No. 15/575,848, Response filed Apr. 6, 2020 to Non Final Office Action dated Nov. 4, 2019", 10 pgs.

"U.S. Appl. No. 15/575,848, Final Office Action dated Apr. 20, 2020", 16 pgs.

"U.S. Appl. No. 15/575,848, Examiner Interview Summary dated Jun. 22, 2020", 3 pgs.

"U.S. Appl. No. 15/575,848, Response filed Jun. 22, 2020 to Final Office Action dated Apr. 20, 2020", 12 pgs.

"U.S. Appl. No. 15/575,848, Advisory Action dated Jul. 1, 2020", 5 pgs.

"U.S. Appl. No. 15/575,848, Appeal Brief filed Sep. 21, 2020", 23 pgs.

"U.S. Appl. No. 15/575,848, Notice of Allowance dated Oct. 13, 2020", 7 pgs.

"U.S. Appl. No. 15/575,848, Corrected Notice of Allowability dated Nov. 20, 2020", 2 pgs.

"U.S. Appl. No. 17/175,757, Non Final Office Action dated Jan. 18, 2022", 7 pgs.

"U.S. Appl. No. 17/175,757, Response filed Apr. 18, 2022 to Non Final Office Action dated Jan. 18, 2022", 9 pgs.

"U.S. Appl. No. 17/175,757, Notice of Allowance dated May 4, 2022", 8 pgs.

\* cited by examiner

SYSTEM FOR OPERATING MULTIPLE TRANSCEIVER MODULES CONCURRENTLY

PRIORITY APPLICATION

This application claims the benefit of priority of U.S. Provisional patent application Ser. No. 62/168,101, filed on May 29, 2015, which is incorporated by reference herein in its entirety.

TECHNICAL FIELD

The present application relates generally to the technical field of mobile computing devices and, in particular, to transmitting/receiving signal data to/from a plurality of transceiver modules.

BACKGROUND

Transceiver devices such as Bluetooth Low Energy (BTLE) devices are often used within a network for transmitting and receiving data from movable objects and/or mobile computing devices. The transmission and reception range of these devices is limited, thus some current solutions utilize a plurality of master transceiver units fixed throughout a defined space to increase the transmission and reception range of the network. Furthermore, signals from multiple transceiver devices received at a single master transceiver dev ice often collide with each other and cause interference with communications.

BRIEF DESCRIPTION OF THE DRAWINGS

The following description includes discussions of figures having illustrations given by way of example of implementations and embodiments of the subject matter disclosed herein. The drawings should be understood by way of example, and not by way of limitation. As used herein, references to one or more "embodiments" are to be understood as describing a particular feature, structure, or characteristic included in at least one implementation of the disclosure. Thus, phrases such as "in one embodiment" or "in an alternate embodiment" appearing herein describe various embodiments and implementations of the disclosure, and do not necessarily all refer to the same embodiment. However, such phrases are also not necessarily mutually exclusive.

Descriptions of certain details and implementations follow, including a description of the Figures, which can depict some or all of the embodiments described below, as well as a description of other potential embodiments or implementations of the concepts presented herein. An overview of embodiments is provided below, followed b a more detailed description with reference to the drawings.

DETAILED DESCRIPTION

The description that follows includes illustrative systems, methods, techniques, instruction sequences, and computing machine program products that embody illustrative embodiments. In the following description, for purposes of explanation, numerous specific details are set forth in order to provide an understanding of various embodiments of the inventive subject matter. It will be evident, however, to those skilled in the art, that embodiments of the disclosure can be practiced without these specific details. In general, well-known instruction instances, protocols, structures, and techniques have not been shown in detail.

Throughout this specification, several terms of art are used. These terms are to take on their ordinary meaning in the art from which they come, unless specifically defined herein or unless the context of their use would clearly suggest otherwise. In the following description, numerous specific details are set forth to provide a thorough understanding of the embodiments. One skilled in the relevant art will recognize, however, that the techniques described herein can be practiced without one or more of the specific details, or with other methods, components, materials, and so forth In other instances, well-known structures, materials, or operations are not shown or described in detail to avoid obscuring certain aspects of the disclosure.

Figure 1A:
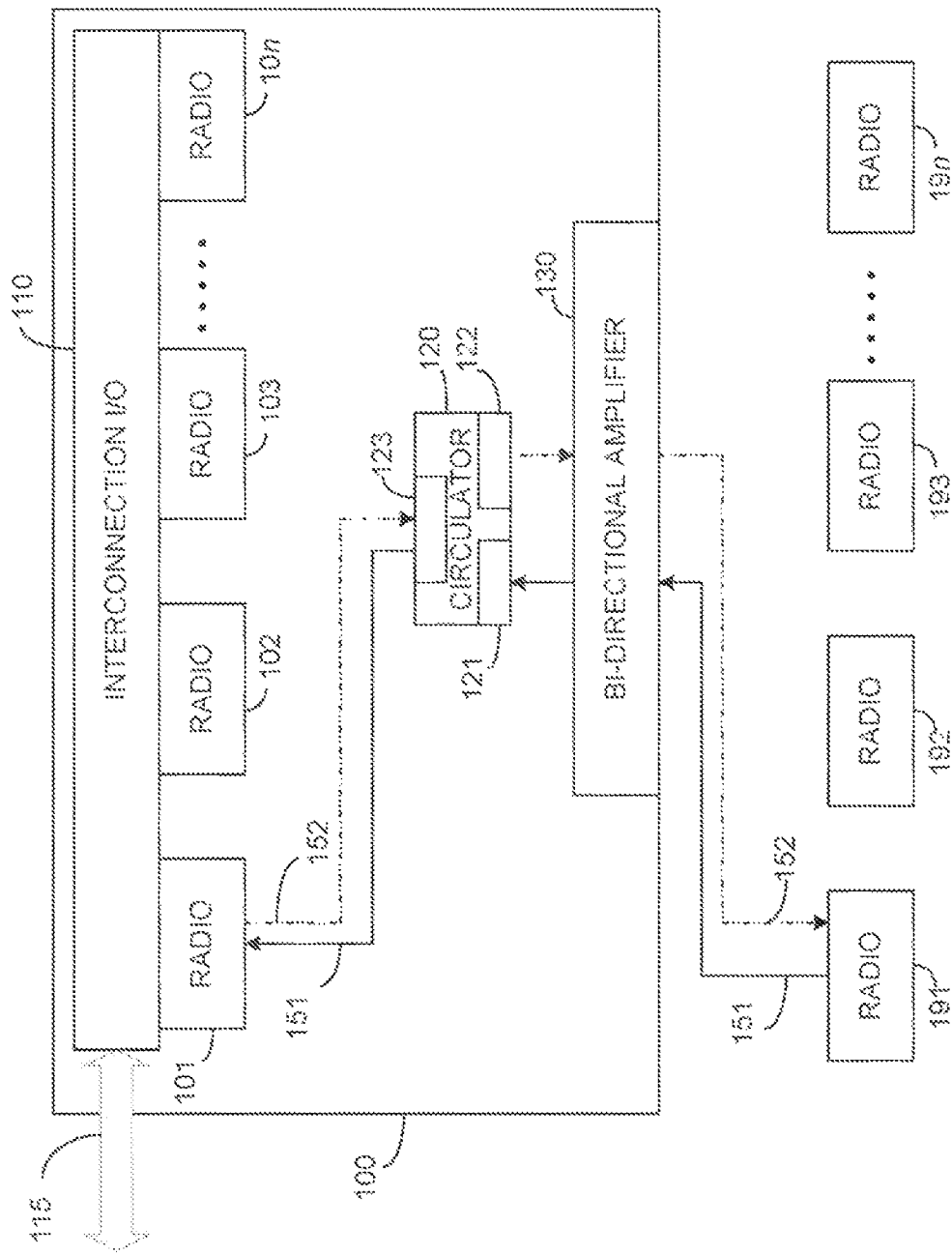
FIG. 1A is an illustration of a system of radio transceiver units in accordance with some embodiments.

FIG. 1A is an illustration of a system of radio transceiver units in accordance with some embodiments. In this embodiment, a radio transceiver dev ice 100 is shown to include a plurality of radio transceiver units 101-10n, each of which correspond to one of a plurality of transceiver units 191-19n that are external to the dev ice 100. The radio transceiver units 101-10n and 191-10n can be any transceiver units capable of communicating via any known wireless communications protocol, such as WiFi (per IEEE 802.11 standard). ZigBee (per IEEE 802.15 standard). Bluetooth (per IEEE 802.15 standard). Near Field Communications (NFC), and so forth. Furthermore, in other embodiments, the functionality of the radio units included mid external to a similar dev ice can vary for example, external radio units can comprise transmission only radio units, and radio units included in a device can comprise reception only radio units, master radio units, and so forth.

The device 100 is illustrated as a peripheral device to be communicatively coupled to a host device via an interconnection input/output (I/O) interface 110, and can communicate via I/O bus 115 corresponding to any known interconnection protocol (e.g., a Peripheral Component Interconnect express (PCIe) protocol, a Small Computer Systems Interface (SCSI) protocol, a Fibre Channel (EC) protocol, a Serial Attached SCSI (SAS) protocol, a Universal Serial Bus (USB) protocol, an Ethernet communication protocol, and so forth). The interconnection I/O interface can include, for example, analog-to-digital converter (ADC) circuitry for cons erring received analog signal data to digital data for the host device, and/or digital-to-analog converter (DAC) circuitry for converting digital data from the host device to analog signal data for transmission.

The device 100 can receive power from the interconnection I/O interface 110 (e.g., via USB or Power Over Ethernet (POE) power connections), or can receive power separately from a power connection interface to an external power or a device power supply (e.g., a battery). The components of the device 100 can be separate components disposed on a common printed circuit board (PCB), or can comprise circuitry included in an application specific integrated circuit (ASIC), such as a system on a chip (SOC) configuration. In some embodiments the components of the device 100 can comprise components integrated with a host device, such that an interconnection I/O interface is not utilized.

The radio transceiver unit 101 of the device 100 is shown to communicate with the external radio transceiver unit 191 via receive/transmit signals 131 and 152. The remaining radio transceiver units 102-10$n$ of the device 100 similarly correspond to the remaining transceiver units 192-19$n$ that are external to the device 100. The device 100 is shown to further include an amplification stage comprising a bi-directional amplifier 130 that includes a first amplification path for signals received by the device lot) (e.g., signal 151) and a second amplification path for signals transmitted by the device 100 (e.g., signal 132).

The amplification stage of the device 100 allow s for the device to operate a plurality of standard short range transceiver devices (e.g., Bluetooth Low Energy (BTLE) devices) as a long range multi-connection system. For example, BTLE transceiver units are typical) limited to an operational distance of 15-20 meters, and the device 100 increases the distance of radio signals exchanged between transceiver units (e.g. the paired radio transceiver units 101 and 191) through the use of the bi-directional amplifier 130.

Figure 1B:
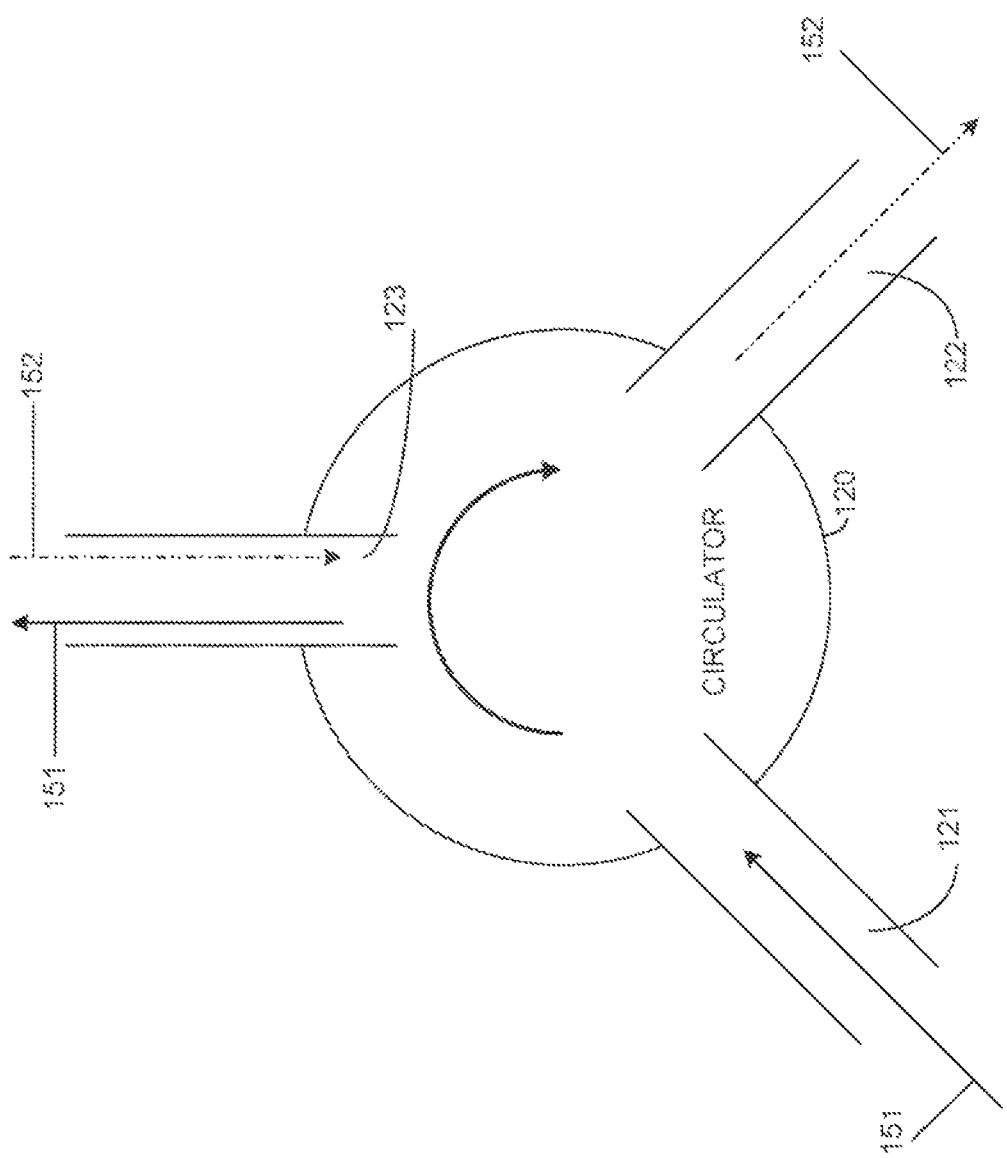
FIG. 1B is an illustration of a radio frequency circulator used with radio transceiver components in accordance with some embodiments.

In this embodiment, the transceiver units 101-10$n$ each correspond to an RF frequency channel, and can each receive a multi-channel RF signal from the circulator 120, filtering for the expected RF channel. The device 100 is shown to further include a circulator 120 functioning as a radio frequency (RF) isolation component. The circulator 120 is shown in further detail in FIG. 1B. The circulator 120 is shown to be configured as a three-port circulator (i e, ports 121-123) used to provide a non-reciprocal effect for transmitted/received signals. The circulator 120 is illustrated as comprising a three-port device which couples a radio frequency signal between adjacent ports in the clockwise direction with little or no attenuation of the signal, but significantly attenuates a signal coupled between adjacent ports in the counter-clockwise direction (circulators used in other embodiments can exhibit different functionality). Thus, the signal 151 received at the port 121 functions as an input terminal for the port 123, which outputs the signal 151 to radio transceiver unit 101. The signal 152 received at the port 123 functions as an input terminal for the port) 122, which outputs the signal 152 for transmission to the external radio transceiver unit 191. Thus, the effect of the circulator is to isolate the ports 121-123 from each other in one direction (i.e., counter-clockwise, from 121-122-123) and to couple the ports 121-123 sequentially to each other in the other direction (i.e., clockwise from 121-123-122) The use of circuitry such as the circulator 120 prevents transmitting signals that may collide with each other and cause interference with the communications.

The device 100 as illustrated in FIG. 1A increases the distance in which transceiver devices can connect and the number of devices that can connect to a host device or system. The multiple radio transceiver units 101-10$n$ teamed together allow for more connections and greater throughput to the external radio transceiver units 190-19$n$.

Figure 2:
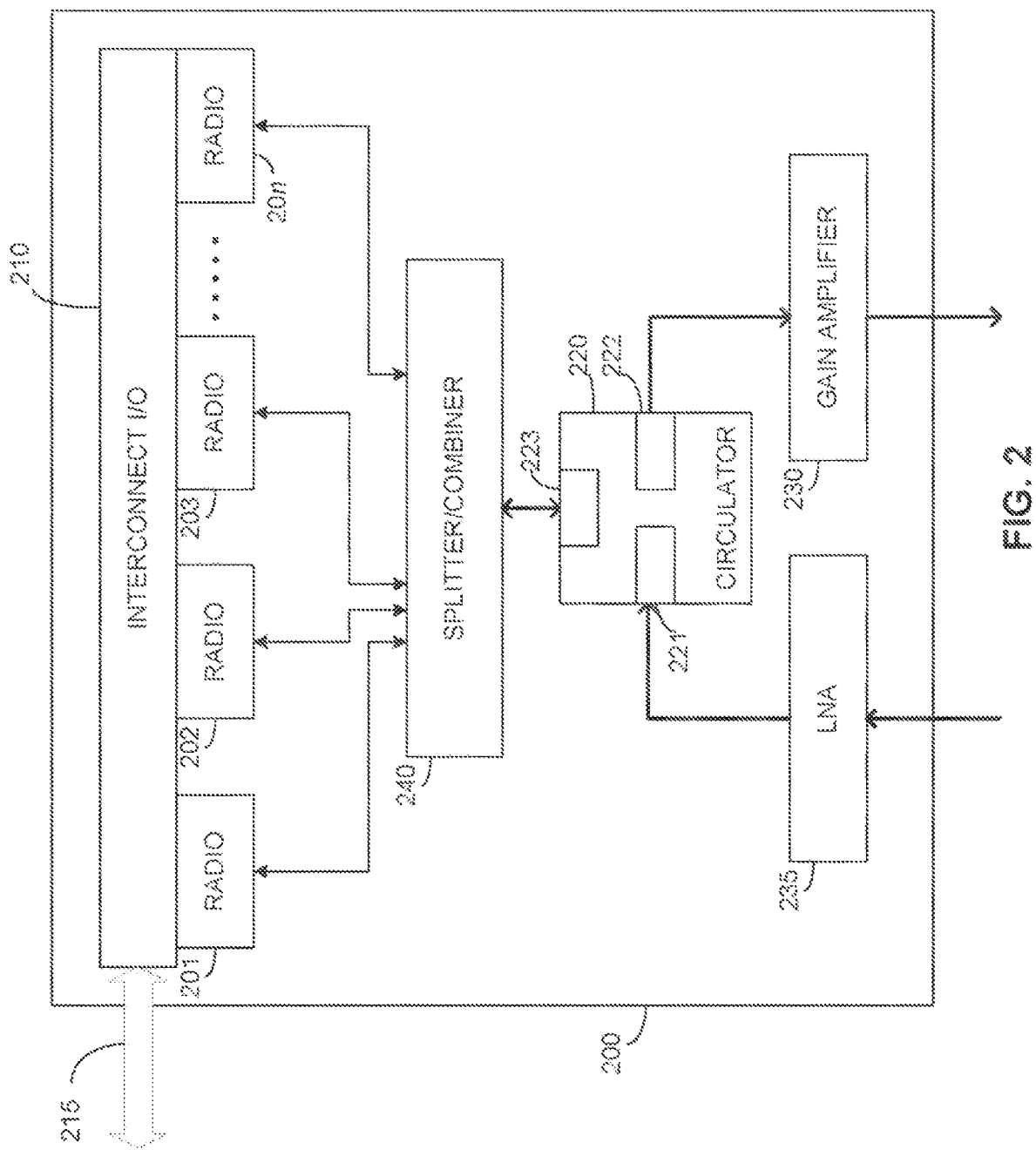
FIG. 2 is an illustration of a device including radio transceiver components in accordance with some embodiments.

FIG. 2 is an illustration of a device including radio transceiver components in accordance with some embodiments. In this embodiment, a radio transceiver de ice 200 is shown to include a plurality of radio transceiver units 201-20$n$, each of which correspond to one of a plurality of transceiver units (not shown) that are external to the device. The device 200 is illustrated as a peripheral device to be communicatively coupled to a host device via an interconnection I/O interface 210, and can communicate via I/O bus 215 corresponding to any known interconnection protocol.

The radio transceiver device 200 is shown to include an amplification stage comprising separate amplifiers for the transmit path and receive paths. A gain amplifier 230 is shown to be used tier the transmit path (i.e., for signals originating from the radio transceiver units 201-20$n$ for the external radio transceiver units) and a low-noise amplifier 235 is shown to be used for the receive path (i e, for signals originating from the external radio transceiver units for the radio transceiver units 201-2017). The low noise amplifier 235 is used to amplify the RF signals received by one or more antennas (not shown) of the device 200, as these signals can be too weak to be directly fed into other circuit components. The low noise amplifier 225 can comprise any type of amplifier that is optimized to produce as little noise as possible while still meeting amplification characteristics for the signal to be processed by one of the radio transceiver units 201-20$n$.

A three-port circulator 220 including ports 221-223 is used to provide a non-reciprocal effect for transmitted/received signals. Signals received at the port 221 are output from the port 223 to a splitter/combiner 240 (described in further detail below). Signals received at the port 223 front the splitter/combiner 240 are output from the port 222. The use of the circulator 220 prevents transmitting signals that may collide with each other causing interference with the communications.

In this embodiment, the splitter/combiner 240 is shown to exchange signal data with the circulator 220. Signal data transmitter/received from the port 223 of the circulator 220 can comprise multi-channel signal data. For data received from the port 223 of the circulator 220, the splitter/combiner 240 splits the received multi-channel signal data into individual channels, each sent to one of the transceiver units 201-20$n$. Thus, in contrast to the dev ice 100 of FIG. 1A, wherein the transceiver units 101-10$n$ can each receive a multi-channel RF signal front the circulator 120 and filter for the expected RF channel, the transceiver units 201-20$n$ oldie device 20$i$) receive individual channel signal data. The splitter-combiner 240 can include, for example, any multiplexing circuitry to multiplex multi-channel signal data into separate channels.

For data output from the splitter/combiner 240 to the port 223 of the circulator 220, the splitter/combiner 240 combines individual channel signal data received from the transceiver units 201-20$n$ into a single multi-channel signal. The splitter-combiner 240 can include, for example, any de-multiplexing circuitry to combine individual signal channels into a multi-channel signal.

Figure 3:
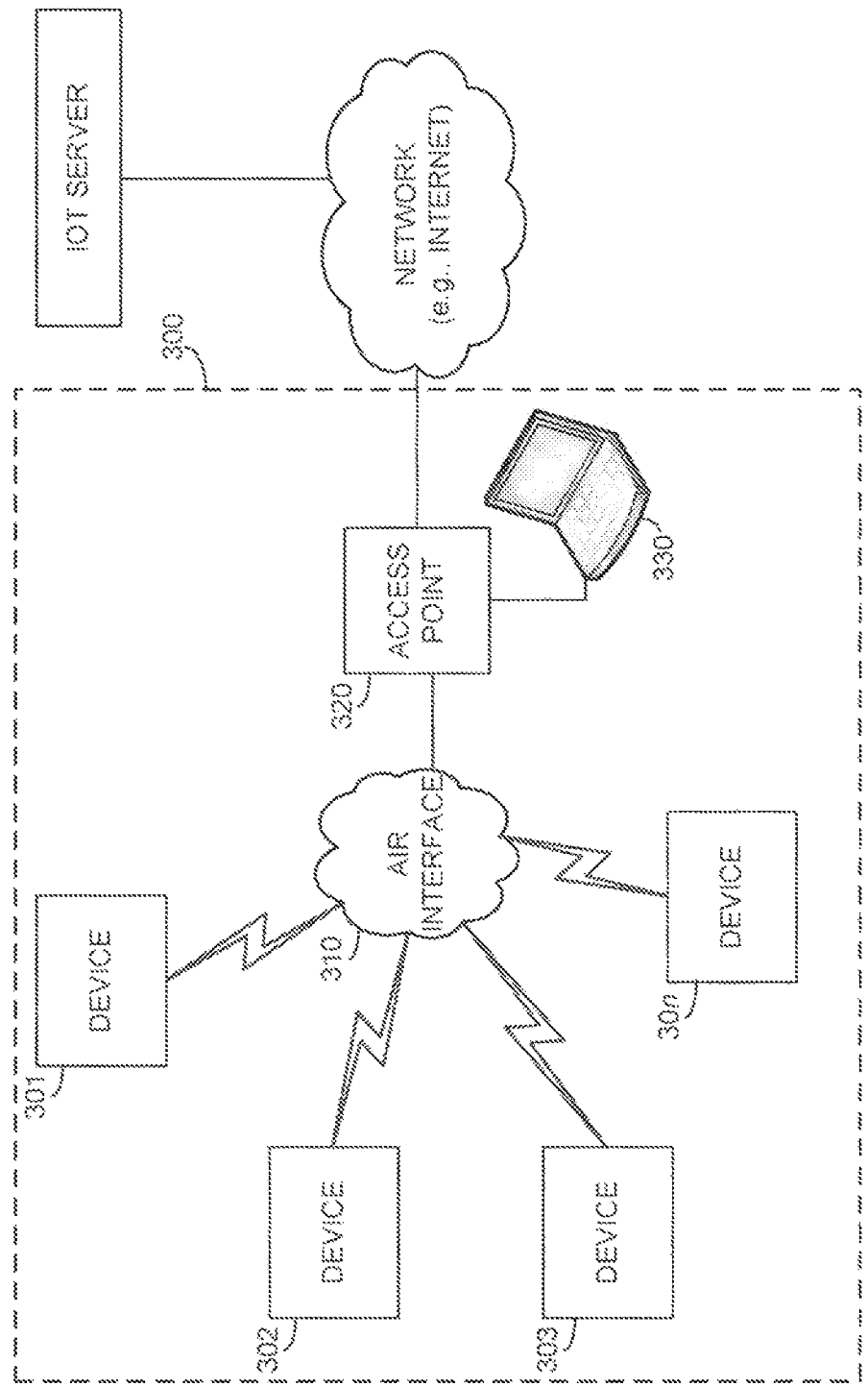
FIG. 3 illustrates a wireless communications system in accordance with some embodiments.

FIG. 3 illustrates a wireless communications system in accordance with some embodiments. In this embodiment, a system 300 is shown to include a plurality of devices 301-30$n$ communicatively coupled to an Internet of Things (IOT) server 350 via a network 340 (e.g., a local ad-hoc network, the Internet, and so forth). IOT communications describe communications involving any transceiver device (e.g., a sensor, a machine, and so forth) that has an addressable wired or wireless interface (e g, an Internet protocol (IP) address, a Bluetooth identifier, an NEC identifier, and so forth) and can transmit information to one or more other devices vin an air interface 310. Each of the devices 301-30n can have an active communication interface, such as transceiver circuitry, or a passive communication interface, such as a quick response (QR) code, a RF identifier (MD) tag, an NIT tag, and so forth.

Accordingly, the system 300 can be comprised of a combination of mobile computing devices (e.g., laptop or desktop computers, smartphones, wearable mobile computing devices, and so forth) in addition to devices that do not typically have Internet-connectivity (e.g., appliances, individual sensors, and so forth). Each of the devices 301-30n device can communicate via the network 340. Communication between devices that do not typically have Internet-connectivity can be referred to as machine-to machine (M2M) communications, wherein interactions between machines can be controlled via a mobile computing device 330 (e.g., for intra-system communications) and/or an IOT seller 350 (e.g., for inter-system communications).

The devices 301-30n can be communicatively coupled to an air interface 310 comprising any wireless communication protocol. In order to increase the transmission/reception range of the devices 301-30n, in communicating with the mobile computing device 330, an access point 320 can be used. The access point 320 can include any of the transceiver devices discussed above (e.g., device 100 of FIG. 1A and device 200 of FIG. 2) to allow for more connections, greater throughput, and greater connection distance.

Figure 4A:
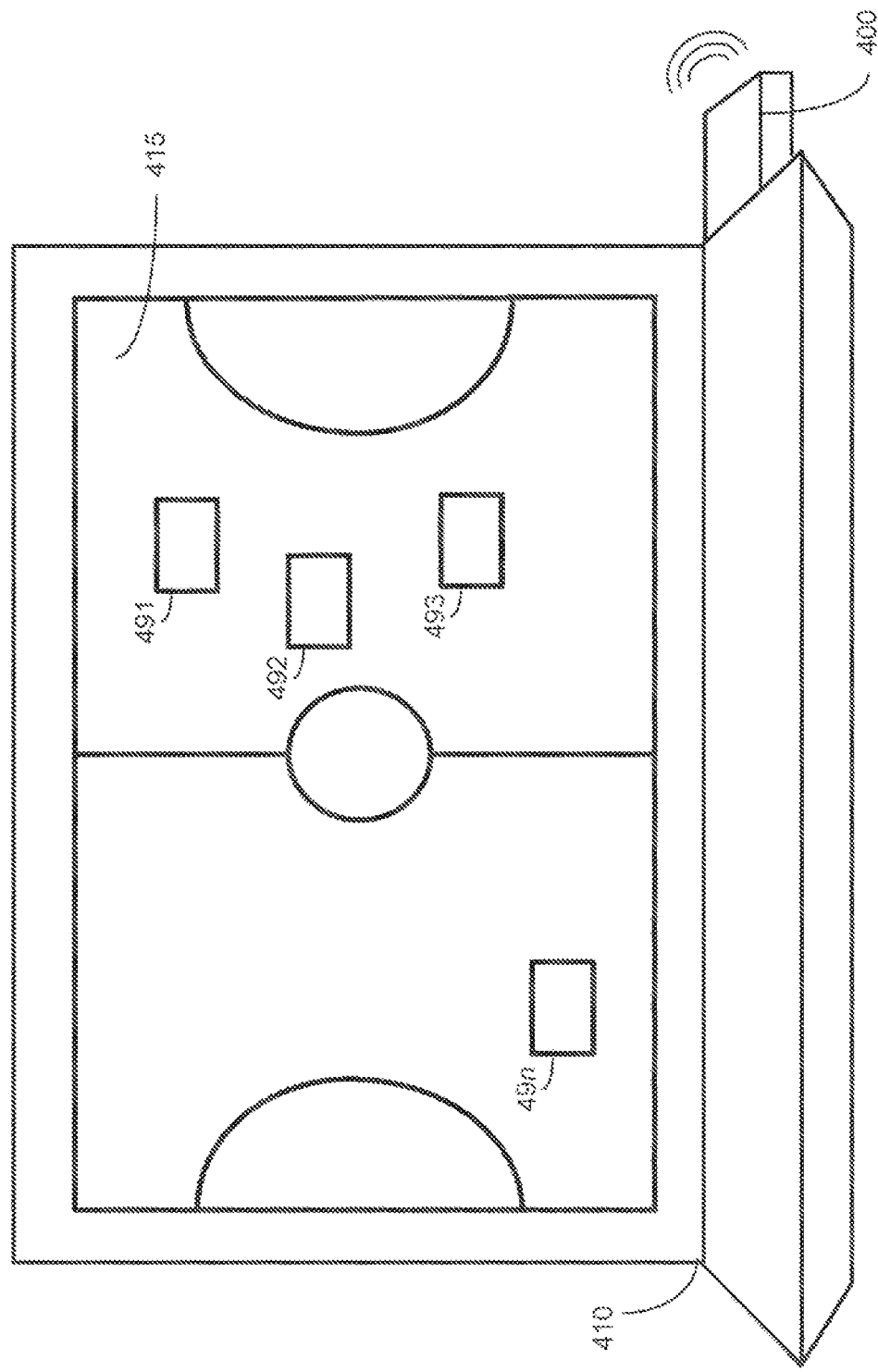
FIG. 4A is an illustration of a mobile computing device and a peripheral device configured for obtaining data from a plurality of moving objects in accordance with some embodiments.

FIG. 4A is an illustration of a mobile computing device and a peripheral device configured for obtaining data from a plurality of moving objects in accordance with some embodiments. In this embodiment, a peripheral device 400 is shown to be removably coupled to a mobile computing device 410.

The peripheral device 400 includes a plurality of transceiver units for obtaining real-time data from one or more external transmission or transceiver units (e.g., sensors, wearable mobile computing devices, and so forth) In this example, the peripheral device 400 is used to obtain movement data from a plurality of players on a soccer pitch, and thereby simultaneously track and display player movement via the display 415 of the mobile computing device 410 (the illustrated system can be used for any type of event, and is not limited to any type of event or environment) In this example, external transmission or transceiver units are worn by the plurality of players, and icons 491-49n are displayed to indicate their real-time position on the soccer pitch. For example, external transmission or transceiver units worn by the plurality of players can transmit location data (e.g., Global Positioning System (GPS) data, wireless triangulation data) to be received by the peripheral device 400 and displayed as a graphical user interface (GUI) is the display 415 of the mobile computing device 310. Any other type of movement (e.g., from a gyroscope or accelerometer sensor) or location data used for location determination processes (e.g., an RFID used for signal strengths or triangulation processes) can be used in other embodiments. Thus, in contrast to existing solutions, such as solutions comprising multiple cameras mounted around a field or area, embodiments can enable any mobile computing device that can be communicatively coupled to peripheral device 400 to track and monitor player movement.

In other embodiments, sensor data received by the peripheral device 400 and processed by the mobile computing device 41)) can correspond to various sports equipment to indicate, for example, speed and position of a ball, measured impact force on a helmet or padding, and so forth. In addition, other sensor data, such as biometric sensor data comprising energy expenditure, heart rate, blood pressure, and so forth, can be received by the peripheral device 400 for the mobile computing device 410 to process in real-time.

Figure 4B:
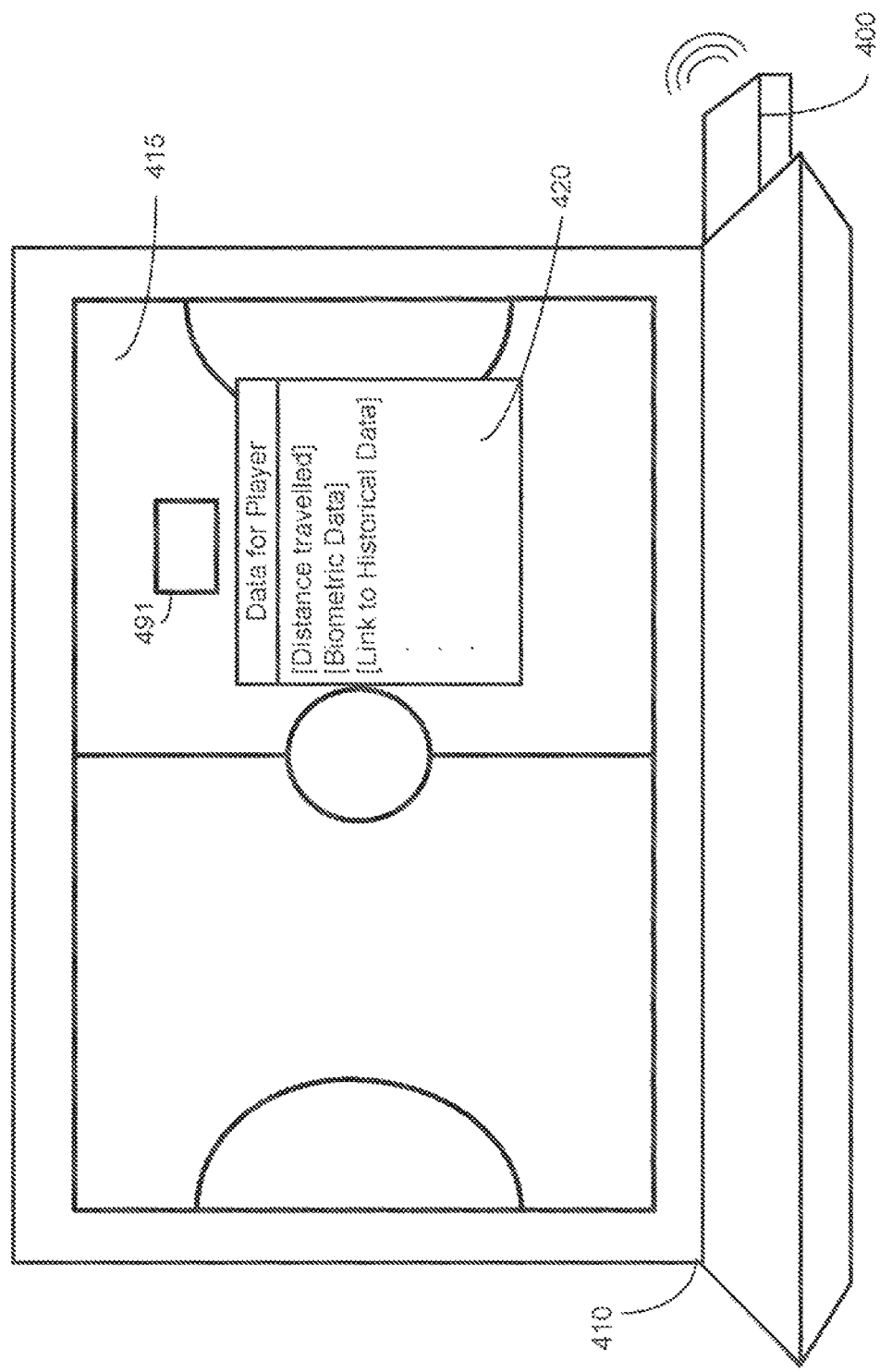
FIG. 4B is an illustration of a real-time display of object attributes in accordance with some embodiments.

FIG. 4B is an illustration of a real-time display of object attributes in accordance with some embodiments. In this embodiment, data fora specific player is displayed in response to a user selecting the icon 491 associated with the player. A display window 420 is displayed within the GUI to display information associated with various sensor information received from the transmission or transceiver device worn by the player. This information can include, but is not limited to, the distance traveled by the player during the event and real-time biometric data of the user. In this embodiment, the display window 420 displays an access link for historical data associated with the player, allowing for a user of the mobile computing device 410 to execute any application for processing any combination of historical and real-time data.

Figure 5:
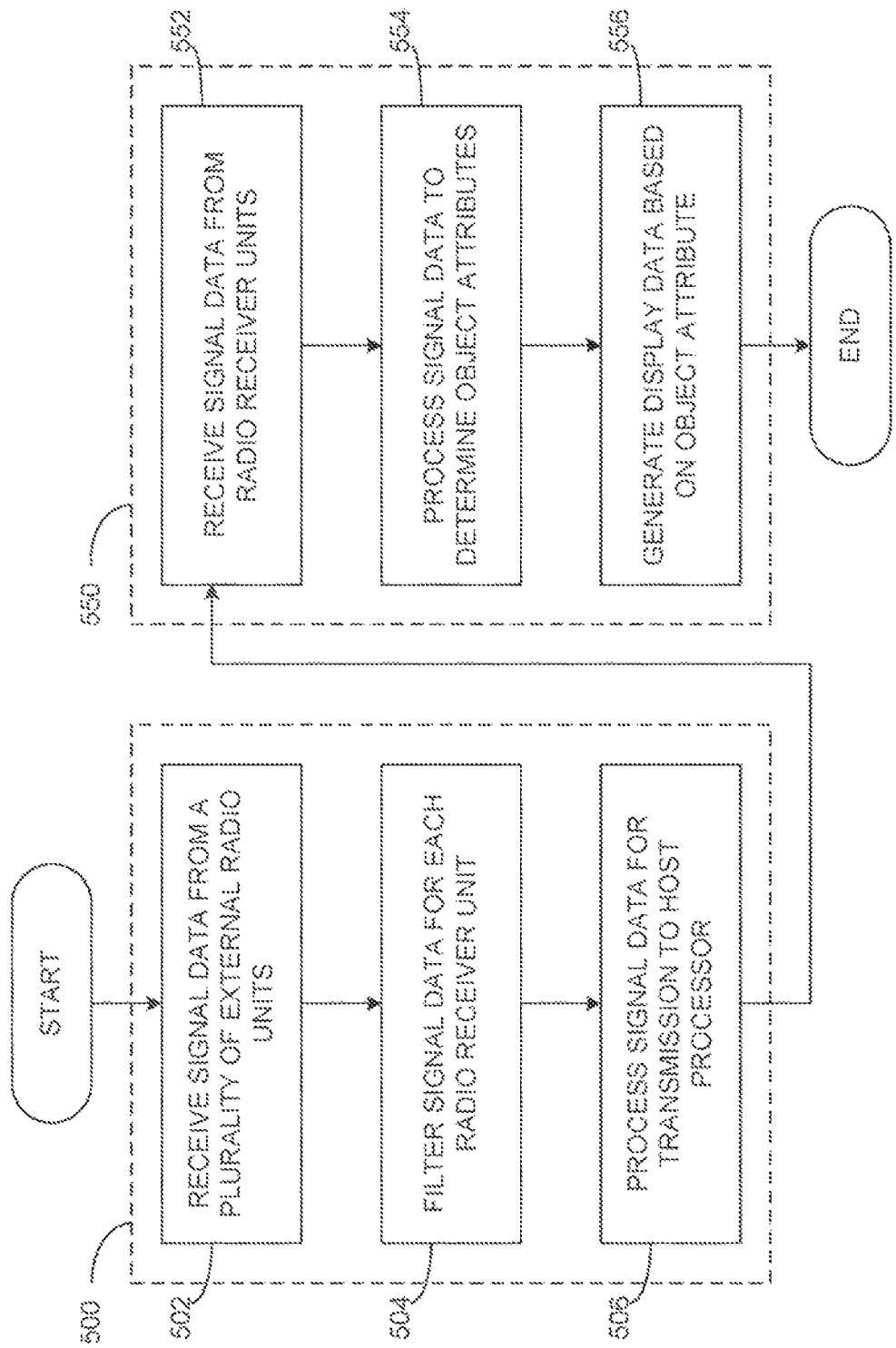
FIG. 5 is an illustration of a flow diagram for processing received signal data in accordance with some embodiments.

FIG. 5 is an illustration of a floss diagram for processing received signal data in accordance with some embodiments. Process and logical flow diagrams as illustrated herein provide examples of sequences of various process actions. Although shown in a particular sequence or order, unless otherwise specified, the order of the actions can be modified. Thus, the described and illustrated implementations should be understood only as examples, and the illustrated processes can be performed in a different order, and some actions can be performed in parallel. Additionally, one or more actions can be omitted in various embodiments: thus, not all actions are executed in every implementation. Other process flows are possible.

Processes 500 and 550 are illustrated as two processes that may be executed by separate devices (e.g., a peripheral device and a host device, respectively) or may be executed by separate components of the same device. The process 500 is shown to include executing an operation to receive signal data from a plurality of external radio units (shown as block 502). As discussed above, the signal data can be received via any wireless communications protocol. The plurality of external radio units each correspond to a separate radio receiver (or transceiver) unit.

An operation is executed to filter signal data for each radio receiver unit (shown as block 504). The filtering can be done at each separate radio receiver unit: for example, each radio receiver unit can receive multi-channel signal data, and can filter for a specific signal channel. In other embodiments, signal splitting circuitry such as a de-multiplexer can be used to separate multi-channel signal data into specific signal channels, which are then received by different radio receiver units.

An operation is executed to process the signal data for transmission to a host processor (shown as block 506). This processing can include converting the received signal data to digital data, and transmitting the digital data to a host memory or a host processor directly. In embodiments where the process 501) is executed via a peripheral device separate from a host device, the data can be transmitted to the host via an interconnection I/O bus consistent with any known interconnection protocol.

The process 550 includes an operation executed to receive signal data from the plurality of radio receiver units (shown as block 552). In the example embodiment discussed above describing FIG. 3, this signal data can correspond to a plurality of machines in an IOT system configuration, such as a plurality of interconnected sensors, devices, appliances, and so forth. In the example embodiment discussed above describing FIG. 4A and FIG. 313, this signal data can correspond to a plurality of objects at a sporting event, such as sensor data captured via sensors coupled to players, equipment, and so forth. Other embodiments are not limited to these examples, and can comprise any multi-radio configuration wherein the signal data from multiple external radio units is received from processing via a host processor.

An operation is executed for processing the received signal data to determine one or more object attributes (shown as block 554). For example, referring to the IOT system configuration of FIG. 3, the received signal data can correspond to various environmental sensors, and this data can be used to determine operating statuses of a plurality of machines. In another example, referring to the system configuration of FIG. 4A and FIG. 413, the received signal data can correspond to biometric data of a plurality of players, location and movement data of a plurality of players and/or sporting equipment, and so forth: this data can be used to determine energy expenditure of the plurality of players, an operating status of sports equipment, and so forth.

An operation is executed to generate display data based on the determined object attribute (shown as block 556) This display data can comprise real time data for a user to track and monitor the current state of a plurality of objects. In embodiments where the process 550 is executed via a host device separate from a peripheral device executing the process 500, the use of the peripheral device provides the host device the ability to efficiently track and monitor multiple objects via the radio receiving units of the peripheral device.

Figure 6:
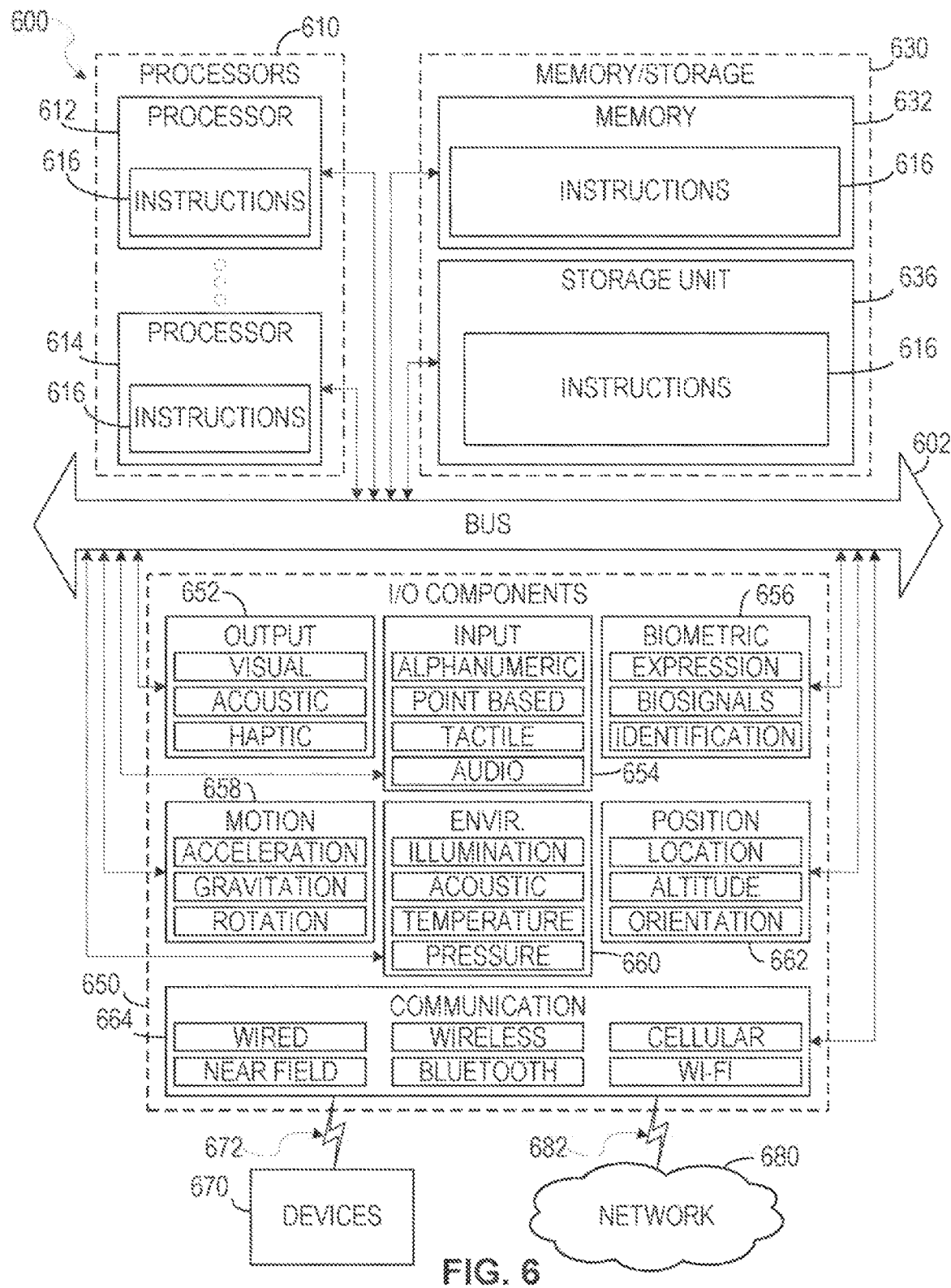
FIG. 6 is a block diagram illustrating components of a machine, according to some example embodiments, able to read instructions from a machine-readable medium and perform any one or more of the methodologies discussed herein, in accordance with some embodiments.

FIG. 6 is a block diagram illustrating components of a machine 600, according to some example embodiments, able to read instructions from a machine-readable medium (e.g., a machine-readable storage medium) and perform an one or more of the methodologies discussed herein. Specifically. FIG. 6 shows a diagrammatic representation of the machine 600 in the example form of a computer system, within which instructions 616 (e.g., software, a program, an application, an applet, an app, or other executable code) for causing the machine 600 to perform any one or more of the methodologies discussed herein may be executed. For example the instructions may cause the machine to execute any portion(s) of the flow diagram of FIG. 3. The instructions transform the general, non-programmed machine into a particular machine programmed to carry out the described and illustrated functions in the manner described. Further, while only a single machine 600 is illustrated, the term "machine" shall also be taken to include a collection of machines 600 that individually or jointly execute the instructions 616 to perform any one or more of the methodologies discussed herein.

The machine 600 may include processors 610, memory 630, and I/O components 650, which may be configured to communicate with each other such as via a bus 602. In an example embodiment, the processors 610 (e.g., a Central Processing Unit (CPU), a Reduced Instruction Set Computing (RISC) processor, a Complex Instruction Set Computing (CISC) processor, a Graphics Processing Unit (GM), a Digital Signal Processor (DSP), an Application Specific Integrated Circuit (ASIC), a Radio-Frequency Integrated Circuit (RFIC), another processor, or any suitable combination thereof) may include, for example, processor 612 and processor 614 that may execute instructions 616. The term "processor" is intended to include a multi-core processor that may comprise two or more independent processors (sometimes referred to as "cores") that may execute instructions contemporaneously Although FIG. 6 shows multiple processors, the machine 600 may include a single processor with a single core, a single processor with multiple cores (e.g., a multi-core process), multiple processors with a single core, multiple processors with multiples cores, or any combination thereof.

The memory/storage 630 may include a memory 632, such as a main memory, or other memory storage, and a storage unit 636, both accessible to the processors 610 such as via the bus 602. The storage unit 636 and memory 632 store the instructions 616 embodying any one or more of the transceiver signal processing methodologies or functions described herein. The instructions 616 may also reside, completely or partially, within the memory 632, within the storage unit 636, within at least one of the processors 610 the processor's cache memory), or any suitable combination thereof, during execution thereof by the machine 600. Accordingly, the memory 632, the storage unit 636, and the memory of processors 610 are examples of machine-readable media As used herein. "machine-readable medium" means a device able to store instructions and data temporarily or permanently and may include, but is not be limited to, random-access memory (RAM), read-only memory (ROM), buffer memory, flash memory, optical media, magnetic media, cache memoir, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store instructions 616. The term "machine-readable medium" shall also be taken to include any medium, or combination of multiple media, that is capable of storing instructions (e.g., instructions 616) for execution by a machine (e.g. machine 600), such that the instructions, when executed by one or more processors of the machine 600 (e.g., processors 610), cause the machine 600 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The I/O components 650 may include a wide variety of components to receive input, provide output, produce output, transmit information, exchange information, capture measurements, and so on. The specific I/O components 650 that are included in a particular machine will depend on the type of machine. For example, portable machines such as mobile phones will likely include a touch input dev ice or other such input mechanisms. It will be appreciated that the I/O components 650 may include many other components that are not shown in FIG. 6. The I/O components 650 are grouped according to functionality merely for simplifying, the following discussion and the grouping is in no way limiting. In various example embodiments, the I/O components 650 may include output components 652 and input components 654. The output components 652 may include visual components (e.g., a display such as a plasma display panel (PDP), a light emitting diode (LED) display a liquid crystal display (LCD), a projector, or a cathode ray tube (CRT)), acoustic components (e.g., speakers), haptic components (e.g., a vibratory motor, resistance mechanisms), other signal generators, and so forth. The input components 654 may include alphanumeric input components (e.g., a keyboard, a touch screen configured to receive alphanumeric input, a photo-optical key board, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like In further example embodiments, the I/O components 650 may include biometric components 656, motion components 658, environmental components 660, or position components 662 among a wide array of other components. For example, the biometric components 656 may include components to detect expressions (e.g., hand expressions, facial expressions, vocal expressions, both gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 65X may include acceleration sensor components (e.g., accelerometer), gravitation sensor components, rotation sensor components (e.g., gyroscope), and so forth. The environmental components 660 may include, for example, illumination sensor components (e.g., photometer), temperature sensor components (e.g., one or more thermometer that detect ambient temperature), humidity sensor components, pressure sensor components (e.g., barometer), acoustic sensor components one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 662 may include location sensor components (e.g., a Global Position System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 650 may include communication components 664 operable to couple the machine 600 to a network 680 or de ices 670 via coupling 682 and coupling 672 respectively. For example, the communication components 664 may include a network interface component or other suitable device to interface with the network 680, and may further include any of the 2*i*) multiple transceiver unit devices described above. In further examples, communication components 664 may include wired communication components, wireless communication components, cellular communication components. Near Field Communication (NEC) components. Bluetooth® components (e.g., Bluetooth® Low Energy), Wi-Fi® components, and other communication components to provide communication via other modalities. The devices 670 may be another machine or any of a wide variety of peripheral devices (e.g., a peripheral device coupled via a Universal Serial Bus (USB)).

Moreover, the communication components 664 may detect identifiers or include components operable to detect identifiers. For example, the communication components 664 may include Radio Frequency Identification (RFID) tag reader components, NEC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 664, such as, location via Internet Protocol (IP) geo-location, location via Wi-Fi® signal triangulation, location via detecting a NEC beacon signal that may indicate a particular location, and so forth.

In various example embodiments, one or more portions of the network 680 may be an ad hoc network, an intranet, an extranet, a virtual private network (VPN), a local area network (LAN), a wireless LAN (WLAN), a s ide area network (WAN), a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, the network 680 or a portion of the network 680 may include a wireless or cellular network and the coupling 682 may be a Code Division Multiple Access (CDMA) connection, a Global System for Mobile communications (GSM) connection, or other type of cellular or w ireless coupling. In this example, the coupling 682 may implement any of a variety of types of data transfer technology, such as Single Carrier Radio Transmission Technology (1×RTT). Evolution-Data Optimized (EVDO) technology. General Packet Radio Service (GPRS) technology, Enhanced Data rates for GSM Evolution (EDGE) technology, third Generation Partnership Project (3GPP) including 3G, fourth generation wireless (1G) networks. Universal Mobile Telecommunications System (UNITS). High Speed Packet Access (HSPA), Worldwide Interoperability for Microwave Access (WiMAX), Long Term Evolution (LTE) standard, others defined by various standard setting organizations, other long range protocols, or other data transfer technology.

The instructions 616 may be transmitted or received over the network 680 using, a transmission medium via a network interface device (e.g., a network interface component included in the communication components 664) and utilizing any one of a number of well-known transfer protocols (e.g., hypertext transfer protocol (HTTP)). Similarly, the instructions 616 may be transmitted or received using a transmission medium via the coupling 672 (e.g., a peer-to-peer coupling) to devices 671). The term "transmission medium" shall be taken to include any intangible medium that is capable of storing, encoding, or carrying instructions 616 for execution by the machine 600, and includes digital or analog communications signals or other intangible medium to facilitate communication of such software.

EXAMPLES

Example embodiments are prodded herein without limitation.

In Example 1, an apparatus includes a plurality of wireless transceiver modules, each wireless transceiver module to be communicatively coupled to a corresponding external transceiver module, one or more antennas to exchange signal data with the plurality of external transceiver modules, a radio frequency (RF) circulator comprising a plurality of ports, including a first port to receive signal data from the one or more antennas, a second port to output signal data from the plurality of wireless transceiver modules to the one or more antennas, and a third port to direct signal data from the first port to one or more of the plurality of wireless transceiver modules, and to direct signal data from one or more of the plurality of wireless transceiver modules to the second port, and one or more amplifiers to amplify the signal data received by the one or more antennas and signal data to be transmitted by the one or more antennas.

In Example 2, the apparatus of Example 1 optionally further includes a signal splitter/combiner disposed between the RF circulator and the plurality of wireless transceiver modules, configured to split the received signal data from the one or more antennas into a plurality of signal channel data corresponding to each of the plurality of wireless transceiver modules and combine signal channel data from the plurality of wireless transceiver modules into a multi-channel signal data.

In Example 3, the apparatus of any one or more of Examples 1 and 2 optionally further includes that the one or more amplifiers comprise a bi-directional amplifier.

In Example 4, the apparatus of any one or more of Examples 1-3 optionally further includes that the one or more amplifiers comprise a gain amplifier to amplify the signal data to be transmitted by the one or more antennas and a low-noise amplifier (IAA) to amplify the signal data received by the one or more antennas.

In Example 5, the apparatus of any one or more of Examples 1-4 optionally further includes that the plurality of wireless transceiver modules comprise a plurality of Bluetooth low energy (BTLE) transceiver modules, a plurality of Wi-Fi transceiver modules, or a plurality of Zigbee transceiver modules.

In Example 6, the apparatus of any one or more of Examples 1-5 optionally further includes an interconnect input/output (I/O) interface to couple the apparatus to a host system and a power coupling circuit to receive power from the host system.

In Example 7, the apparatus of any one or more of Examples 1-6 optionally further includes that the interconnect I/O interface and the power coupling circuit are included in a Universal Serial Bus (USB) interface.

In Example 8, the apparatus of any one or more of Examples 1-7 optionally further includes that the interconnect I/O interface comprises an Ethernet interface and the power coupling circuit comprises a power-over-Ethernet (POE) port.

In Example 9, the apparatus of any one or more of Examples 1-8 optionally further includes a battery power supply configured to provide power to the apparatus.

In Example 10, a system includes a first set of wireless transceiver modules, and a transceiver device comprising a second set of wireless transceiver modules corresponding to the first set of wireless transceiver modules, one or more antennas to transmit signal data to the first set of wireless transceiver modules, and to receive data from the first set of wireless transceiver modules, a radio frequency (RF) circulator comprising a plurality of ports including a first port to receive signal data from the one or more antenna, a second port to output signal data from the second set of wireless transceiver modules to the one or more antennas, and a third port to direct signal data from the first port to one or more of the second set of wireless transceiver modules, and to direct signal data from one or more of the second set of wireless transceiver modules to the second port, and one or more amplifiers to amplify the signal data received by the one or more antennas, and signal data to be transmitted by the one or more antennas.

In Example 11, the system of Example 10 optionally further includes that the transceiver device further comprises a signal splitter/combiner disposed between the RF circulator and the plurality of wireless transceiver modules, configured to split the received signal data from the one or more antennas into a plurality of signal channel data corresponding to each of the plurality of wireless transceiver modules and combine signal channel data from the plurality of wireless transceiver modules into a multi-channel signal data.

In Example 12, the system of any one or more of Examples 10 and 11 optionally further includes that the one or more amplifiers of die transceiver device comprise a bi-directional amplifier.

In Example 13, the system of any one or more of Examples 10-12 optionally further includes that the one or more amplifiers of the transceiver device comprise a gain amplifier to amplify the signal data to be transmitted by the one or more antennas and a low-noise amplifier (LNA) to amplify the signal data received by the one or more antennas.

In Example 14, the system of any one or more of Examples 10-13 optionally further includes that the plurality of wireless transceiver modules of the transceiver device comprise a plurality of Bluetooth low energy (BTLE) transceiver modules, a plurality of Wi-Fi transceiver modules, or a plurality of Zigbee transceiver modules.

In Example 15, the stein of any one or more of Examples 10-14 optionally further includes a mobile computing device communicatively coupled to the transceiver device, wherein the transceiver device further comprises an interconnect input/output (I/O) interface to couple the transceiver to the mobile computing device and a power coupling circuit to receive power from the mobile computing device.

In Example 16, the system of any one or more of Examples 10-15 optionally further includes that the interconnect I/O interface and the power coupling circuit of the transceiver device are included in a Universal Serial Bus (USB) interface.

In Example 17, the system of any one or more of Examples 10-16 optionally further includes that the interconnect I/O interface of the transceiver device comprises an Ethernet interface and the power coupling circuit of the transceiver device comprises a power-over-Ethernet (POE) port.

In Example 18, the system of any one or more of Examples 10-17 optionally further includes that the transceiver device further comprises a battery power supply configured to provide power to the transceiver device.

In Example 19, the system of any one or more of Examples 10-18 optionally further includes that the first set of wireless transceiver modules and the transceiver device are included in an Internet of Things (IOT) network.

In Example 20, a method includes receiving signal data from a first set external radio units, each external radio unit coupled to an object, filtering the received signal data for each of a second set of radio units corresponding to the first set of external radio units, processing the received signal data for transmission to one or more processing units, determining, via the one or more processing units, object attributes for each of the objects coupled to the first set of external radio units based, at least in part, on the received signal data, and generating display data for one of more of the object attributes for display via a graphical user interface (GUI).

In Example 21, the method of Example 20 optionally further includes that the one or more processing units are included in a mobile computing device, and the second set of radio units are included in a peripheral device removably coupled to mobile computing device.

In Example 22, the method of any one or more of Examples 20 and 21 optionally further include that the second set of radio units and the one or more processing units are included in a mobile computing device.

In Example 23, the method of any one or more of Examples 20-22 optionally further include splitting, with a signal splitter/combiner the received signal data from one or more antennas into a plurality of signal channel data corresponding to each of a plurality of wireless transceiver modules and combining, with the signal splitter/combiner, signal channel data from the plurality of xv ireless transceiver modules into a multi-channel signal data.

In Example 24, the method of any one or more of Examples 20-23 optionally further include amplifying, with one or more amplifiers, the signal data received by the one or more antennas and signal data to be transmitted by the one or more antennas.

In Example 25, the method of one or more of Examples 20-24 optionally further include that the one or more amplifiers comprise a gain amplifier to amplify the signal data to be transmitted by the one or more antennas and a low-noise amplifier (LNA) to amplify the signal data received by the one or more antennas.

In Example 26, the method of any one or more of Examples 20-25 optionally further include that the plurality of wireless transceiver modules comprise a plurality of Bluetooth low energy (BTU) transceiver modules, a plurality of Wi-Fi transceiver modules, or a plurality of Zigbee transceiver modules.

Although an embodiment has been described with reference to specific example embodiments, it will be evident that various modifications and changes can be made to these embodiments. Accordingly, the specification and drawings are to be regarded in an illustrative rather than a restrictive sense. The accompanying, drawings that form a part hereof show, by way of illustration, and not of limitation, specific embodiments in which the subject matter can be practiced. The embodiments illustrated are described in sufficient detail to enable those skilled in the art to practice the teachings disclosed herein Other embodiments can be utilized and derived therefrom, such that structural and logical substitutions and changes can be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter can be referred to herein, individually and/or collectively, by the term "invention" merely for convenience and without intending to voluntarily limit the scope of this application to an single invention or inventive concept if more than one is in fact disclosed. Thus, although specific embodiments have been illustrated and described herein, it should be appreciated that any arrangement calculated to achieve the same purpose can be substituted for the specific embodiments shown. This disclosure is intended to cover any and all adaptations or variations of various embodiments. Combinations of the above embodiments, and other embodiments not specifically described herein, will be apparent to those of skill in the art upon reviewing the abort description.

The Abstract of the Disclosure is provided to allow the reader to quickly ascertain the nature of the technical disclosure. It is submitted with the understanding, that it will not be used to interpret or limit the scope or meaning of the claims in addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment

What is claimed is:

1. An apparatus comprising:
   a plurality of wireless transceiver modules, each wireless transceiver module to be communicatively coupled to a corresponding external transceiver module;
   one or more antennas to exchange signal data with the plurality of external transceiver modules;
   a radio frequency (RF) circulator comprising a plurality of ports, including:
   a first port to receive signal data from the one or more antennas;
   a second port to output signal data from the plurality of wireless transceiver modules to the one or more antennas; and
   a third port to direct signal data from the first port to one or more of the plurality of wireless transceiver modules, and to direct signal data from one or more of the plurality of wireless transceiver modules to the second port;
   a signal splitter/combiner disposed between the RF circulator and the plurality of wireless transceiver modules, the signal splitter/combiner operatively coupled to the third port and configured to:
   split the received signal data from the one or more antennas into a plurality of signal channel data corresponding to each of the plurality of wireless transceiver modules; and
   combine signal channel data from the plurality of wireless transceiver modules into a multi-channel signal data.

2. The apparatus of claim 1, wherein the plurality of wireless transceiver modules comprise a plurality of Bluetooth low energy (BTLE) transceiver modules, a plurality of Wi-Fi transceiver modules, or a plurality of Zigbee transceiver modules.

3. The apparatus of claim 1, further comprising:
   an interconnect input/output (I/O) interface to couple the apparatus to a host system; and
   a power coupling circuit to receive power from the host system.

4. The apparatus of claim 3, wherein the interconnect I/O interface and the power coupling circuit are included in a Universal Serial Bus (USB) interface.

5. The apparatus of claim 4, wherein the interconnect I/O interface comprises an Ethernet interface and the power coupling circuit comprises a power-over-Ethernet (POE) port.

6. The apparatus of claim 1, further comprising:
   a battery power supply configured to provide power to the apparatus.

7. A system comprising:
a first set of wireless transceiver modules; and
a transceiver device comprising:
a second set of wireless transceiver modules corresponding to the first set of wireless transceiver modules;
one or more antennas to exchange signal data with the first set of transceiver modules;
a radio frequency (RF) circulator comprising a plurality of ports, including:
a first port to receive signal data from the one or more antennas;
a second port to output signal data from the second set of wireless transceiver modules to the one or more antennas; and
a third port to direct signal data from the first port to one or more of the second set of wireless transceiver modules, and to direct signal data from one or more of the second set of wireless transceiver modules to the second port;
a signal splitter/combiner disposed between the RF circulator and the second set of wireless transceiver modules, the signal splitter/combiner operatively coupled to the third port and configured to:
split the received signal data from the one or more antennas into a plurality of signal channel data corresponding to each of the second set of wireless transceiver modules; and
combine signal channel data from the second set of wireless transceiver modules into a multi-channel signal data.

8. The system of claim 7, wherein the first set of wireless transceiver modules are operatively coupled to an associated one of a plurality of pieces of sport equipment configured to be positioned on a sport field.

9. The system of claim 8, further comprising:
a processor configured to receive the signal data received from each of the second set of wireless transceiver modules and determine a position location of the corresponding one of the first set of wireless transceiver modules on the sport field; and
a display, configured to display a representation of the sport field and, for each of the first set of wireless transceiver modules, a real-time position of the associated one of the player and the sport equipment on the sport field.

10. The system of claim 9, wherein the transceiver device comprises the processor and the display.

11. The system of claim 7, wherein the second set of wireless transceiver modules of the transceiver device comprise a plurality of Bluetooth low energy (BTLE) transceiver modules, a plurality of Wi-Fi transceiver modules, or a plurality of Zigbee transceiver modules.

12. The system of claim 7, further comprising:
a mobile computing device communicatively coupled to the transceiver device;
wherein the transceiver device further comprises:
an interconnect input/output (I/O) interface to couple the transceiver device to the mobile computing device; and
a power coupling circuit to receive power from the mobile computing device.

13. The system of claim 12, wherein the interconnect I/O interface and the power coupling circuit of the transceiver device are included in a Universal Serial Bus (USB) interface.

14. The system of claim 12, wherein the interconnect I/O interface of the transceiver device comprises an Ethernet interface and the power coupling circuit of the transceiver device comprises a power-over-Ethernet (POE) port.

15. The system of claim 7, wherein the transceiver device further comprises:
a battery power supply configured to provide power to the transceiver device.

16. The system of claim 7, wherein the first set of wireless transceiver modules and the transceiver device are included in an Internet of Things (IOT) network.

17. A method of making an apparatus, comprising:
obtaining a plurality of wireless transceiver modules, each wireless transceiver module to be communicatively coupled to a corresponding external transceiver module;
obtaining one or more antennas to exchange signal data with the plurality of external transceiver modules;
obtaining a radio frequency (RF) circulator comprising a plurality of ports, including:
a first port to receive signal data from the one or more antennas;
a second port to output signal data from the plurality of wireless transceiver modules to the one or more antennas; and
a third port to direct signal data from the first port to one or more of the plurality of wireless transceiver modules, and to direct signal data from one or more of the plurality of wireless transceiver modules to the second port;
operatively coupling the first port to the one or more antennas;
operatively coupling the second port to the one or more antennas;
operatively coupling the third port to the plurality of wireless transceiver modules;
operatively coupling a signal splitter/combiner between the RF circulator and the plurality of wireless transceiver modules, the signal splitter/combiner operatively coupled to the third port and configured to:
split the received signal data from the one or more antennas into a plurality of signal channel data corresponding to each of the plurality of wireless transceiver modules; and
combine signal channel data from the plurality of wireless transceiver modules into a multi-channel signal data.

18. The method of claim 17, wherein the plurality of wireless transceiver modules comprise a plurality of Bluetooth low energy (BTLE) transceiver modules, a plurality of Wi-Fi transceiver modules, or a plurality of Zigbee transceiver modules.

19. The method of claim 17, further comprising:
operatively coupling an interconnect input/output (I/O) interface between the apparatus to a host system; and
a power coupling circuit to receive power from the host system.

20. The method of claim 19, wherein the interconnect I/O interface and the power coupling circuit are included in a Universal Serial Bus (USB) interface.

* * * * *